(12) United States Patent
Jiang

(10) Patent No.: US 9,106,197 B2
(45) Date of Patent: Aug. 11, 2015

(54) SYSTEMS AND METHODS TO SUPPRESS NOISE AND IDLE TONES

(75) Inventor: Xicheng Jiang, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 344 days.

(21) Appl. No.: 13/572,154

(22) Filed: Aug. 10, 2012

(65) Prior Publication Data

US 2014/0044280 A1 Feb. 13, 2014

(51) Int. Cl.
*H04B 15/00* (2006.01)
*H03G 3/34* (2006.01)
*H03M 3/00* (2006.01)

(52) U.S. Cl.
CPC ............. *H03G 3/341* (2013.01); *H03M 3/346* (2013.01); *H03M 3/50* (2013.01)

(58) Field of Classification Search
CPC ...... H04R 3/005; H04R 1/406; H04R 1/2201; H04R 1/401; H04R 2201/403; H04R 25/407; H04R 2410/07; G11B 20/24; G10L 21/0208; G10L 2021/02165
USPC .............................. 378/92, 94.1; 381/92, 94.1
See application file for complete search history.

(56) References Cited

U.S. PATENT DOCUMENTS

| 5,646,990 | A | * | 7/1997 | Li | 379/406.08 |
| 5,796,847 | A | * | 8/1998 | Kaihotsu et al. | 381/57 |
| 6,172,635 | B1 | * | 1/2001 | Nakamura et al. | 341/155 |
| 6,369,739 | B1 | * | 4/2002 | Inada et al. | 341/155 |
| 7,697,699 | B2 | * | 4/2010 | Ozawa | 381/94.1 |
| 2002/0121994 | A1 | * | 9/2002 | Bolton, Jr. | 341/143 |
| 2002/0186776 | A1 | * | 12/2002 | Cosand | 375/247 |
| 2006/0038709 | A1 | * | 2/2006 | Lu et al. | 341/143 |
| 2007/0058822 | A1 | * | 3/2007 | Ozawa | 381/94.1 |

OTHER PUBLICATIONS

Perez Gonzalez, et al. "Idle tone behavior in Sigma Delta Modulation," Audio Engineering Society $122^{nd}$ Convention, May 5-8, 2007, Vienna, Austria, 13 pages.

* cited by examiner

*Primary Examiner* — Simon Sing
(74) *Attorney, Agent, or Firm* — Sterne, Kessler, Goldstein & Fox P.L.L.C.

(57) ABSTRACT

Systems and methods that reduce or remove idle tones and noise from an audio signal are provided. According to various embodiments, a level of the received input signal is detected and a control signal can be generated based on the detected level. When the detected level is above a pre-determined threshold value, then the input signal (which may have been processed) is output. When the input falls below the pre-determined threshold, then a constant signal is output instead, where the constant signal may be one of a ground signal, or other constant voltage signal.

19 Claims, 7 Drawing Sheets

SYSTEMS AND METHODS TO SUPPRESS NOISE AND IDLE TONES

FIELD OF THE INVENTION

The invention relates to systems and methods that can be used to suppress or reduce noise and idle tones.

BACKGROUND

Many audio devices become subject to audible noise after certain test patterns. For instance, sometimes a high level signal followed by a mute or low level signal can produce a phenomenon called idle noise or idle tones. Idle tones are the unwanted appearance of partial artifacts in an output signal that were not present in the original input signal. There are a number of techniques for mitigating idle noise in circuits. Most of the techniques for mitigating the idle noise or tones involve the use of additional filtering components.

Adding additional filtering components to an audio system can, however, be undesirable. For instance, adding a filtering component to an audio baseband chip consumes valuable chip real estate and can increase the cost of the baseband chip. Similarly, external filtering components increase the cost of an audio system because they require relatively expensive components (e.g., inductors, resistors and capacitors) to implement. Accordingly, there is a need for systems and methods that eliminate unwanted noise or idle tones from an audio signal without relying on internal or external filtering components.

BRIEF SUMMARY

According to embodiments of the invention, a system for processing audio signals is provided. The system includes a signal processor, a signal detector, and a selector. The signal processor is configured to receive an input signal and output a processed signal based on the input signal. The signal detector is configured to detect a level of the input signal and to output a control signal based on the detected level of the input signal. The selector is configured to receive the processed signal, the control signal, and a constant signal. Depending on the control signal, the selector outputs either the processed signal or the constant signal. According to various embodiments, the selector can be configured to output the processed signal if the control signal indicates that the input signal is above a certain threshold level. Additionally, the selector can be configured to output the constant signal if the control signal indicates that the input signal is below a threshold level.

BRIEF DESCRIPTION OF THE DRAWINGS/FIGURES

Embodiments of the disclosure are described with reference to the accompanying drawings. In the drawings, like reference number indicate identical or functionally similar items. Additionally, the left-most digit(s) of a reference number indicates the drawing in which the reference number first appears.

DETAILED DESCRIPTION

Figure 1:
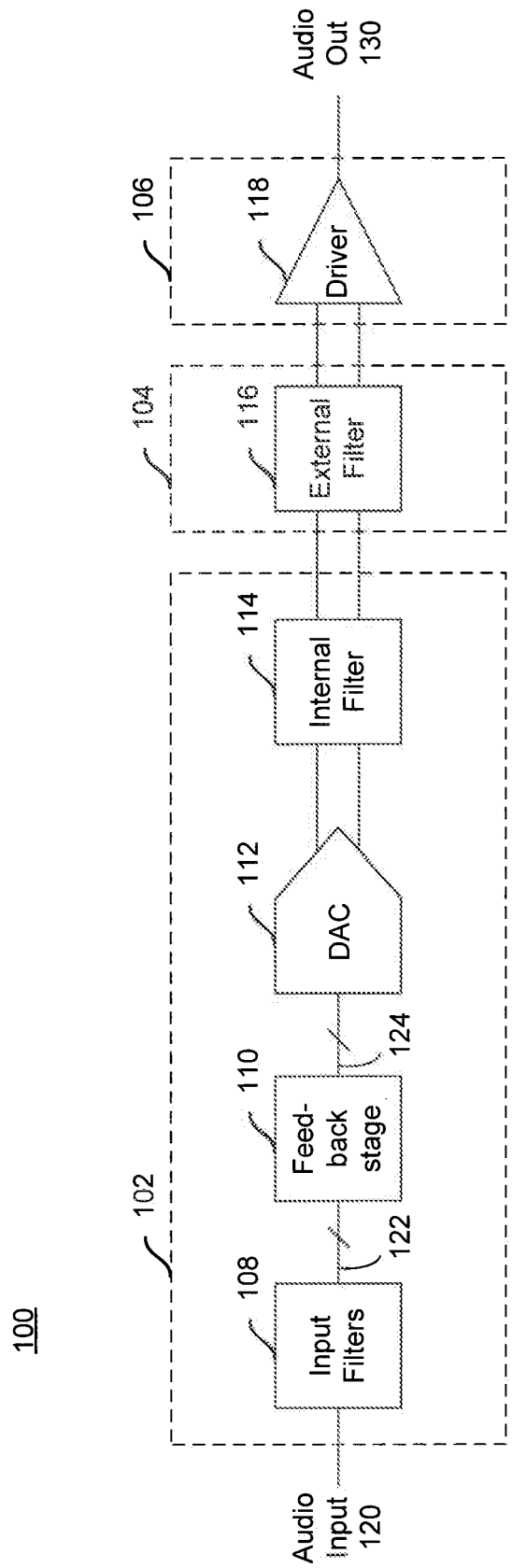
FIG. 1 is block diagram illustrating an audio device according to various embodiments of the invention.

The following detailed description refers to accompanying drawings to illustrate exemplary embodiments consistent with the disclosure. References in the detailed description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art to affect such a feature, structure, or characteristic in connection with other exemplary embodiments whether or not explicitly described.

The exemplary embodiments described herein are provided for illustrative purposes, and are not limiting. Other exemplary embodiments are possible and modifications may be made to the exemplary embodiments within the spirit and scope of the disclosure. Further, the detailed description is not meant to limit the invention, as the scope of the invention is defined only in accordance with the following claims and their equivalents.

Embodiments of the disclosure may be implemented in hardware, firmware, software, or any combination thereof. Embodiments of the disclosure may also be implemented as instructions stored on a computer-readable medium which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices, and others. Further, firmware, software, routines, and instructions may be described herein as performing certain actions. However, it should be appreciated that such descriptions are merely for convenience and that such actions in fact result from competing devices, processors, controllers or other devices executing the firmware, software, routines, instructions, etc.

The following detailed description of the exemplary embodiments will so fully reveal the general nature of the disclosure that others can, by applying knowledge of those skilled in the relevant arts readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in the relevant arts in light of the teachings herein.

FIG. 1 illustrates an audio device 100. The audio device 100 includes a baseband component 102, an external filter component 104, and an audio driver component 106. The baseband component 102 may include input filters 108 that receive a digital audio input, a feedback module 110, a digital-to-analog converter (DAC) 112, and a filter 114. The filter component 104 may include an external filter 116. The audio driver component 106 may include a driver 118, which may amplify the analog signal produced by the DAC 112 and filtered by the internal filter 114 and the external filter 116.

According to various embodiments, input filter 108 receives a digital audio input 120, which may be any of a number of well-known digital audio signals (e.g., CD format, WMA, MP3, etc.). The input filter 108 can then filter the input and produce a filtered signal 122. The filtered signal may take a number of different forms according to the various embodiments and may, for instance, comprise a number of bits per data sample. For instance, in some embodiments, the filtered signal is 24 bits per data sample, though any number of bits might be used depending on the requirements of a particular system.

Figure 2:
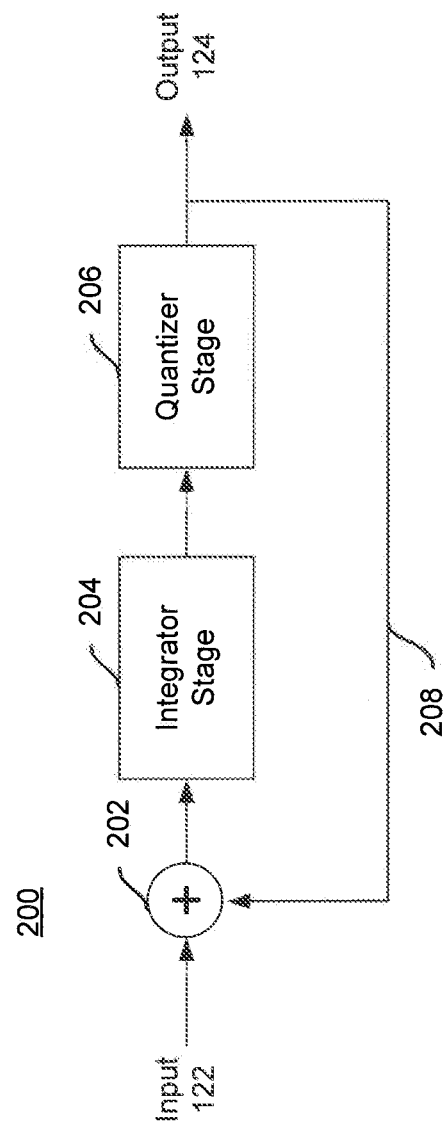
FIG. 2 is a block diagram illustrating a feedback circuit according to various embodiments of the invention.

The feedback module 110 receives the filtered input signal 122 and can be used to encode the input signal 122 into a processed signal 124 which can be, for instance, a noise shaped, high resolution digital signal with a lower number of bits per data sample according to various embodiments. The feedback module 110 may employ a feedback loop to reduce error. FIG. 2 illustrates an exemplary feedback module 110 implemented as a sigma-delta modulator (SDM) 200. The SDM 200 comprises a combiner 202, an integrator stage 204, a quantizer stage 206, and a feed-back loop 208, where the combiner combines the output 124 with the 122 via the feedback loop 208. The integrator stage 204 may comprise a chain of integrators that integrates the output of the combiner 202. The quantizer 206 can be either a single bit or multi-bit comparator. In the case of a quantizer being implemented as a multi-bit comparator, the quantizer comprises multiple comparators in a comparator array.

Digital-to-analog converter 112 can receive the processed signal 124 from the feedback module 110 and output a corresponding analog signal. In a number of cases the processed signal may include a number of undesirable and audible artifacts that have been introduced by the feedback module 110. For instance, when a SDM is used to implement the feedback module 110, idle tones can be introduced into the signal.

In general, idle tones are unwanted, and are often an audible phenomenon that are associated with the appearance of partial artifacts in the output of a SDM, but that were not present in the input signal. Idle tones typically occur when the input to an SDM falls below a certain threshold. Idle tones become audible when their frequency falls in the audible range of the human ear and their magnitude is bigger than the audible human threshold. To remove any audible idle tones, audio device 100 employs internal filter 114 and external filter 116. However, in view of the fact that filters 114 and 116 use valuable real estate and can require additional power, expensive components, and additional design considerations, it can be desirable to eliminate idle tones without relying on filtering according to various embodiments. The output from the filter stages 114 and 116 is received by driver 118, which produces an analog audio output 130 that can then be coupled to a speaker or other appropriate audio output device.

Figure 3:
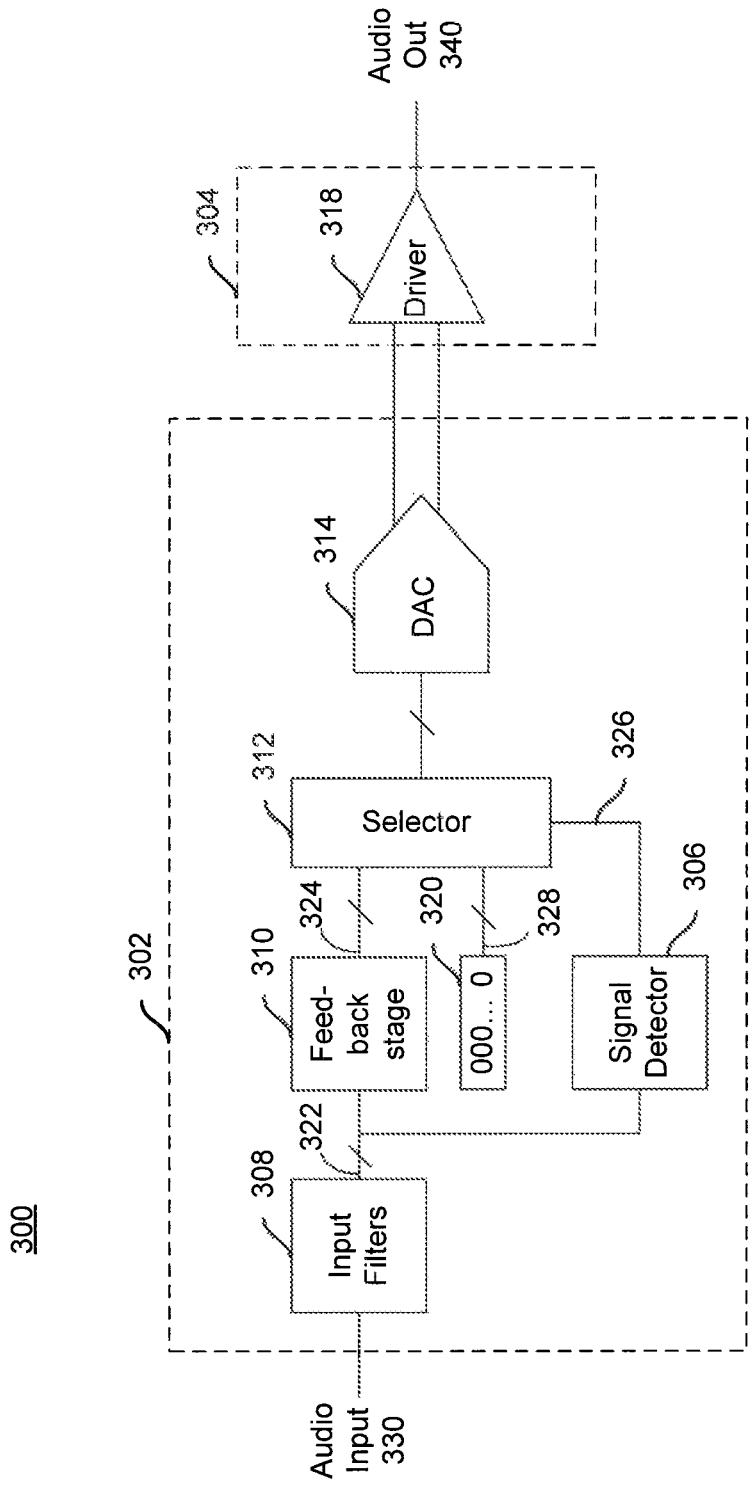
FIG. 3 is a block diagram illustrating an audio device according to various embodiments of the invention.

FIG. 3 illustrates an audio device 300 according to embodiments of the disclosure, which can reduce or eliminate idle tones without relying on subsequent filtering. The audio device 300 includes a baseband module 302 and a driver module 304. The baseband module 302 includes input filters 308, a feedback module 310, a selector 312, a signal detector 306, a constant signal generator 320, and a digital-to-analog converter (DAC) 314. The driver module 304 may include a driver 318 that provides an audio output 340 that is suitable to drive a speaker or other sound transducer.

The input filter module 308 can receive a digital audio input 330 and filter it to produce a filtered signal 322. The filtered signal may, according to various embodiments, comprise multiple bits (e.g., 24 bits per sample according to some embodiments) and can be received as an input by both the feedback module 310 and the signal detector 306.

The feedback module 310 receives the filtered audio input from the input filter 308 and outputs a processed signal to selector 312. According to various embodiments, the feedback module 310 may be implemented as a sigma delta modulator such as SDM 200 illustrated in FIG. 2. The feedback module may encode the received filtered signal 322 to generate a processed signal 324, which may comprise a noise shaped high resolution digital signal with a lower number of bits per sample according to various embodiments.

The selector 312 also receives the output from the constant signal generator 320 and a control signal from the signal detector 306. According to various embodiments, the constant signal generator 320 is configured to generate a constant signal 328, which could be multiple bits per sample according to various embodiments. The constant signal 328 could, for instance, comprise the same number of bits per sample as the processed signal 324. The constant signal generator can be implemented as one or more ground connections (e.g. 0V) or could also be configured to provide a selectable and constant voltage (e.g., 0V, 5V, 10V, etc.), or the digital representation thereof. In other words, the constant signal 328 can be a digital representation of a selectable constant voltage (e.g., 0V, 5V, 10V, etc.). The selector 312 is configured to output either the processed signal 324 (based on the audio input 330) or the generated constant signal 328, to the DAC 314 based on the value of control signal 326. In various embodiments, the selector 312 can be implemented as a 2N-to-N multiplexer, where N is the number of bits in each of the processed signal 324 and the constant signal 328.

Control signal 326 is generated by signal detector 306. The signal detector 306 is configured to detect a level of the input signal and output a control signal 326 based on the detected signal level as compared to a threshold signal level. For instance, when the signal detector detects that the input signal is above a certain threshold (e.g., –80 dB), the signal detector could generate a control signal 326, which causes the selector 312 to select and output the processed signal 324. When the signal detector 306 detects that the input signal is below the threshold, it can generate a control signal 326 that causes the selector 312 to output the constant signal 328. Accordingly, when the input signal 322 is below the threshold, then the output of the feedback stage 310 is replaced by the constant signal 328 as seen from the perspective of the DAC 314, in order to obviate the idle tones that are generated by the feedback stage 310 during low input signal. Once the selection is made, then the DAC 314 converts the selected signal to analog for amplification by the driver 318 so as produce the audio output 340.

According to some embodiments, the signal detector may only consider the M most significant bits of filtered input signal 322, and ignore the L least significant bits. The values of M and L can be determined by the desired threshold. The signal detector may then simply detect whether any of the M most significant bits is non-zero and generate the appropriate control signal accordingly. For instance, if any of the M most significant bits are detected to be non-zero, then the signal detector can determine that the filtered input signal is above the threshold, and therefore the processed signal 324 is to be forwarded to the DAC 314 for further processing to produce the audio output 340. If all of the M most significant bits are detected to be zero, then the signal detector 306 can determine that the filtered input signal is below the threshold, and therefore the constant signal 328 is used to replace the filtered input signal 228.

While signal detector 306 is shown detecting the filtered input signal 328, the signal detector 306 may also detect the unfiltered input signal 330 according to various embodiments. In this way, the idle tone noise can be filtered out without relying on the internal filter 114 or the external filter 116 depicted by FIG. 1.

Figure 4:
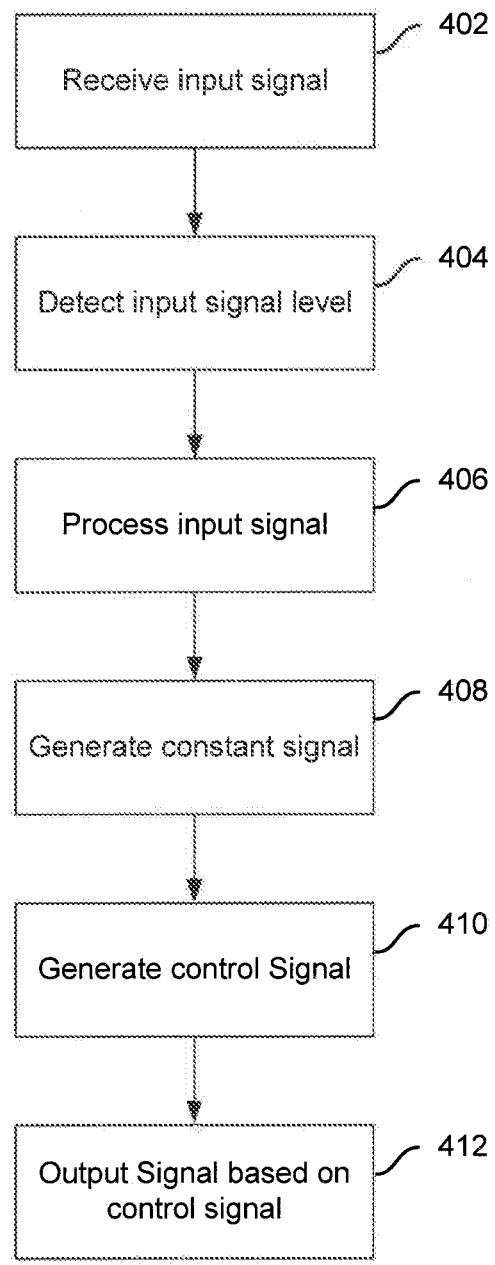
FIG. 4 is a flow chart illustrating a method of suppressing noise and idle tones according to various embodiments of the invention.

FIG. 4 depicts a method 400 for removing noise or idle tones from the output of an audio device according to embodiments of the disclosure. As is shown, the input signal is received at step 402. The input signal may comprise a digital audio signal encoded in a number of different formats (e.g., MP3, CD, AAC, WMA, etc.). A level of the input signal can be detected at step 404. The level of the input signal may be determined by comparing the value of the signal to known values, and/or a threshold. According to some embodiments, the input signal is a digital signal so that only the M most significant bits of the input signal are examined when determining the level. That is, the L least significant bits are excluded from the level determination. The values of M and L may be adjustable according to some embodiments.

At step 406, the input signal is processed. According to some embodiments, the input signal may be processed by a feedback module such as SDM 200 depicted in FIG. 2, which can generate undesired idle tones at low input signal levels. For instance, the inputs signal 322 could be encoded as noise shaped, high resolution digital signal with a lower number of bits per sample by feedback module 310 and output as signal 324.

At step 408 a constant signal can be generated. According to some embodiments, the constant signal can be generated by connecting the signal lines to ground. However the constant signal may also comprise a non-ground value and, in particular, a selectable non-ground value (e.g., 5V, 10V, etc.). The constant signal may be presented in digital form, e.g. a digital representation of ground.

A control signal can be generated at step 410 by, for instance, the signal detector 320. According to various embodiments, the signal detector could generate a control signal 326 that indicates that the processed signal 324 should be output by the selector when the input is above a pre-determined amplitude threshold. Additionally, the signal detector 320 could generate a control signal 326 that indicates that the constant signal 328 should be output by the selector 312 when the input is below a pre-determined amplitude threshold. At step 412, either the constant signal 328 or the processed input signal 234 is selected based on the control signal 326, where the selected signal is further processed to provide the audio output. As such, the generated constant signal may be considered to replace the processed input signal for low input signal levels, so as to obviate idle tones prevalent at low signal levels.

Figure 5:
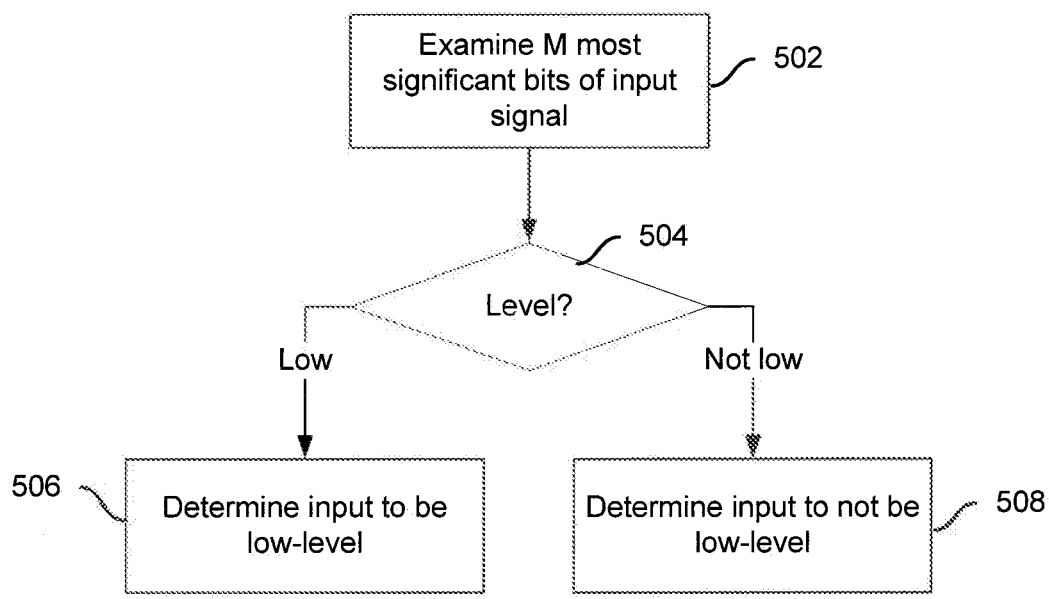
FIG. 5 is a flow chart illustrating a method of determining the level of an input signal according to various embodiments of the invention.

FIG. 5 depicts a method 500 of determining the level (e.g. amplitude or power) of an input signal according to various embodiments of the disclosure. According to the method, an input signal is examined, for instance by the signal detector 306, at step 502. As discussed above with reference to FIG. 3, the input signal can be examined in an un-filtered form 330 or in a filtered form 322. According to some embodiments, only the M most significant bits of the input signal may be examined. The number of bits examined can be static, or adjustable according to some embodiments.

At step 504, the method can determine whether the input signal is low-level or not. This might be done by, for instance, determining whether the M most significant bits are zero or non-zero. For instance, if one or more of the examined M bits are non-zero, then the determination might be made that the input signal is not low-level at step 508. Similarly, if all of the examined M bits are zero, then the determination might be made that the input signal is low level at step 506. The method could also classify input signals into several (i.e., more than two) different levels according to various embodiments.

Figure 6:
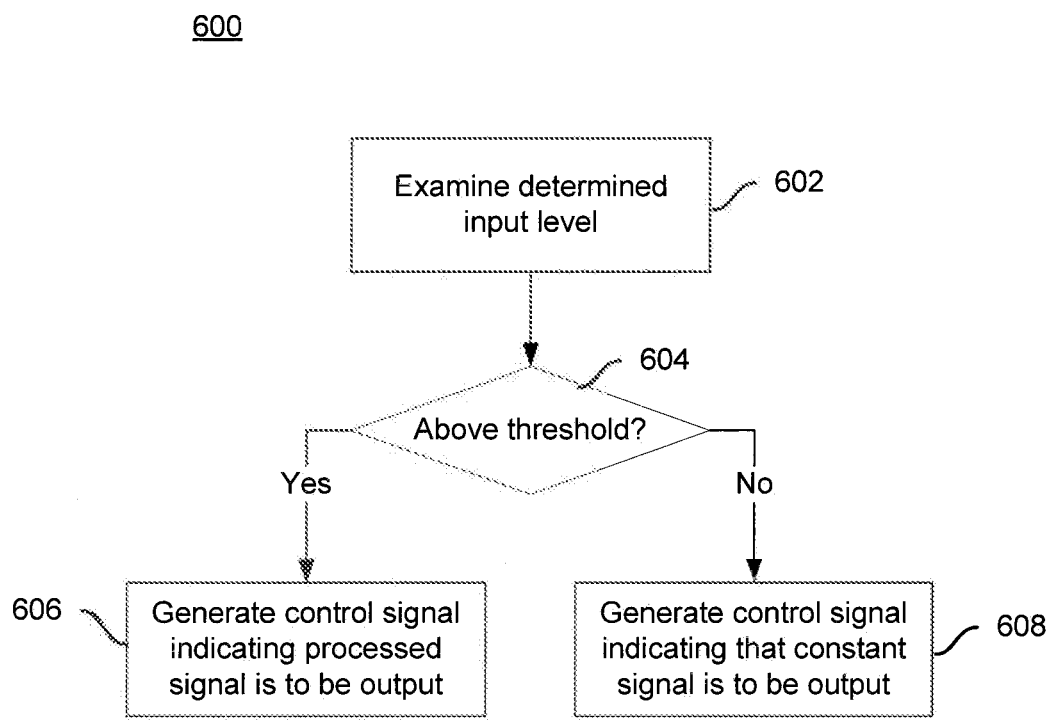
FIG. 6 is a flow chart illustrating a method of generating a control signal according to various embodiments of the invention.

FIG. 6 illustrates a method of generating a control signal based on an input signal level according to embodiments of the present disclosure. According to embodiments, the level of the determined input level is examined at step 602. The signal detector 320, for instance, can then determine whether the input level is above a pre-determined threshold at step 604. For instance, if the level is determined to be above a pre-determined threshold, at step 604, then a control signal is generated that indicates the processed signal 324 should be output at step 606. If, however, the input level is determined to be below the threshold at step 604, then a control signal 326 is generated indicating that the constant signal 328 is to be output at step 608. According to some embodiments, the determination of whether the input signal 322 is above or below a pre-determined threshold level can be made by determining whether the M most significant bits of the input signal are non-zero or not. For instance, if one or more are non-zero, then the input signal is above the threshold and if they are all zero, then the input signal is below the threshold. In this scenario, the threshold can be changed by varying the number of M; considering more of the input bits will lower the threshold and considering fewer will raise the threshold. Based on the kind of control signal 326 that is generated (either at step 606 or 608), the selector 312 outputs either the processed signal 324 or the constant signal 328.

Figure 7:
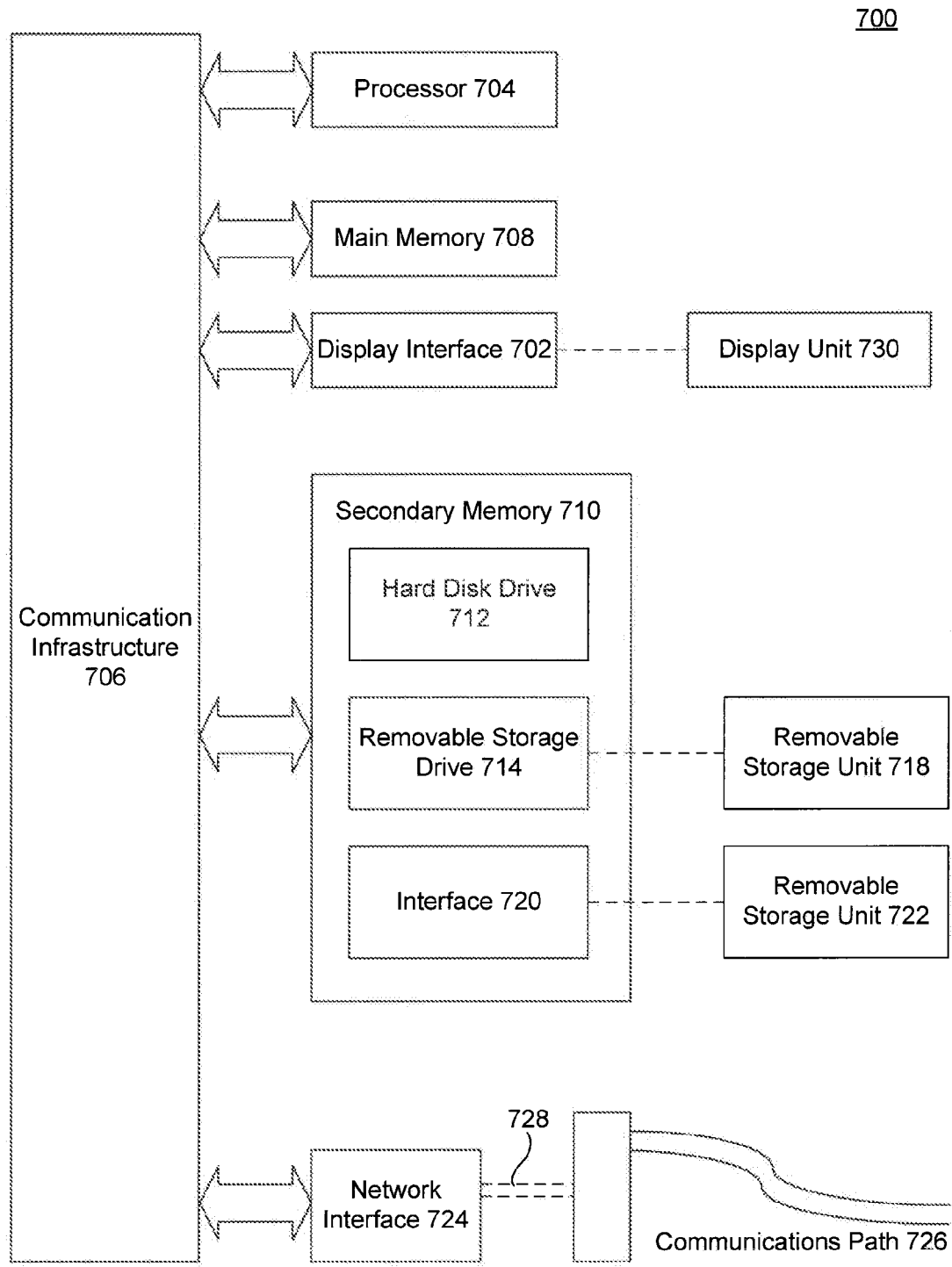
FIG. 7 is a block diagram illustrating a computer system on which various embodiments of the invention can be implemented.

Various aspects of the present disclosure can be implemented by software, firmware, hardware, or a combination thereof. FIG. 7 illustrates an example computer system 700 in which the present disclosure, or portions thereof, can be implemented as computer-readable code. For example, portions of baseband module 302, signal detector 306, etc. can be implemented by computer system 700. Various embodiments of the disclosure are described in terms of this example computer system 700. After reading this description, it will become apparent to a person skilled in the relevant art how to implement the disclosure using other computer systems and/or computer architectures.

Computer system 700 includes one or more processors, such as processor 704. Processor 704 can be a special purpose or a general purpose processor. Processor 704 is connected to a communication infrastructure 706 (for example, a bus or network).

Computer system 700 also includes a main memory 708, preferably random access memory (RAM), and may also include a secondary memory 710. Secondary memory 710 may include, for example, a hard disk drive 712, a removable storage drive 714, and/or a memory stick. Removable storage drive 714 may comprise a floppy disk drive, a magnetic tape drive, an optical disk drive, a flash memory, or the like. The removable storage drive 714 reads from and/or writes to a removable storage unit 718 in a well-known manner. Removable storage unit 718 may comprise a floppy disk, magnetic tape, optical disk, etc. that is read by and written to by removable storage drive 714. As will be appreciated by persons skilled in the relevant art(s), removable storage unit 718 includes a computer usable storage medium having stored therein computer software and/or data.

In alternative implementations, secondary memory 710 may include other similar means for allowing computer programs or other instructions to be loaded into computer system 500. Such means may include, for example, a removable storage unit 722 and an interface 720. Examples of such means may include a program cartridge and cartridge interface (such as that found in video game devices), a removable memory chip (such as an EPROM, or PROM) and associated socket, and other removable storage units 722 and interfaces 720 that allow software and data to be transferred from the removable storage unit 722 to computer system 700.

Computer system 700 may also include a communications interface 724. Communications interface 724 allows software and data to be transferred between computer system 700 and external devices. Communications interface 724 may include a modem, a network interface (such as an Ethernet card), a communications port, a PCMCIA slot and card, or the like. Software and data transferred via communications interface 724 are in the form of signals that may be electronic, electromagnetic, optical, or other signals capable of being received by communications interface 724. These signals are provided to communications interface 724 via a communications path 726. Communications path 726 carries signals and may be implemented using wire or cable, fiber optics, a phone line, a cellular phone link, an RF link or other communications channels.

In this document, the terms "computer program medium" and "computer usable medium" are used to generally refer to media such as removable storage unit 718, removable storage unit 722, and a hard disk installed in hard disk drive 712. Signals carried over communications path 726 can also embody the logic described herein. Computer program medium and computer usable medium can also refer to memories, such as main memory 708 and secondary memory 710, which can be memory semiconductors (e.g. DRAMs, etc.). These computer program products are means for providing software to computer system 700.

Computer programs (also called computer control logic) are stored in main memory 708 and/or secondary memory 710. Computer programs may also be received via communications interface 724. Such computer programs, when executed, enable computer system 700 to implement the present invention as discussed herein. In particular, the computer programs, when executed, enable processor 704 to implement the processes of the present disclosure. Accordingly, such computer programs represent controllers of the computer system 700. Where the invention is implemented using software, the software may be stored in a computer program product and loaded into computer system 700 using removable storage drive 714, interface 720, hard drive 712 or communications interface 724.

The disclosure is also directed to computer program products comprising software stored on any computer useable medium. Such software, when executed in one or more data processing device, causes a data processing device(s) to operate as described herein. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.).

CONCLUSION

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be appreciated that the Detailed Description and not the Abstract, is intended to be used to interpret the claims. The Abstract may set forth one or more, but not all exemplary embodiments of the disclosure, and thus, are not intended to limit the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the following claims and their equivalents.

What is claimed is:

1. A system for processing audio signals, comprising:
    a signal processor configured to receive a digital input signal comprising a plurality of bits and output a processed signal based on the digital input signal;
    a constant signal generator configured to generate a constant signal comprising a plurality of bits;
    a signal detector configured to detect a level of the digital input signal and to output a control signal based on the detected level; and
    a selector configured to receive the processed signal, the control signal, and the constant signal and to output the processed signal or the constant signal based on the control signal.

2. The system of claim 1, wherein the signal detector is configured to detect the level of the digital input signal by examining a portion of the digital input signal and determining whether the examined portion of the digital input signal exceeds a pre-determined threshold value.

3. The system of claim 2, wherein the signal detector is configured to output a control signal that will cause the selector to output the processed signal when the examined portion of the digital input signal exceeds the pre-determined threshold value and to output a control signal that will cause the selector to output the constant signal when the examined portion of the digital input signal does not exceed the pre-determined threshold value.

4. The system of claim 2, wherein the pre-determined threshold value is programmable.

5. The system of claim 2, wherein the examined portion of the digital input signal excludes a pre-determined number of least significant bits.

6. The system of claim 1, wherein the signal processor is a sigma delta modulator (SDM) that comprises an integrator stage and a quantizer stage.

7. The system of claim 6, wherein the integrator stage comprises a chain of integrators and wherein the quantizer stage comprises a comparator.

8. The system of claim 1, wherein the control signal is determined so that the processed signal is replaced with the constant signal when the level of the digital input signal is below a threshold.

9. The system of claim 1, wherein the constant signal is one of a ground signal or other constant voltage signal.

10. The system of claim 1, wherein the signal detector is configured to detect the level of the digital input signal by considering the M most significant bits of the digital input signal and ignoring the L least significant bits.

11. A method for processing audio signals, comprising:
processing a received digital input signal comprising a plurality of bits to produce a processed signal;
generating a constant signal comprising a plurality of bits;
detecting a level of the digital input signal and generating a control signal based on the detected level; and
selecting either the processed signal or the constant signal based on the generated control signal and outputting the selected signal.

12. The method of claim 11, wherein the level of the digital input signal is detected by examining a portion of the digital input signal and determining whether the examined portion of the digital input signal exceeds a pre-determined threshold value.

13. The method of claim 12, wherein the generated control signal is configured to cause the processed signal to be output when the examined portion of the digital input signal exceeds the pre-determined threshold value, and wherein the generated control signal is configured to cause the constant signal to be output when the examined portion of the digital input signal does not exceed the pre-determined threshold value.

14. The method of claim 12, wherein the examined portion of the digital input signal excludes a pre-determined number of least significant bits.

15. The method of claim 11, wherein the digital input signal is processed using a sigma delta modulator (SDM).

16. The method of claim 15, wherein the SDM comprises an integrator stage and a quantizer stage.

17. The method of claim 16, wherein the integrator stage comprises a chain of integrators and wherein the quantizer stage comprises a comparator.

18. The method of claim 11, wherein the constant signal is one of a ground signal or other constant voltage signal.

19. A non-transitory computer readable storage medium containing computer instructions that, when executed by a processor, cause the processor to perform steps comprising:
processing a received digital input signal comprising a plurality of bits to produce a processed signal;
generating a constant signal comprising a second plurality of bits;
detecting a level of the digital input signal and generating a control signal based on the detected level; and
selecting either the processed signal or the constant signal based on the generated control signal and outputting the selected signal.

* * * * *